United States Patent
Sugita et al.

(10) Patent No.: US 9,001,096 B2
(45) Date of Patent: Apr. 7, 2015

(54) DISPLAY DEVICE

(75) Inventors: Yasuhiro Sugita, Osaka (JP); Kohei Tanaka, Osaka (JP); Christopher Brown, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 358 days.

(21) Appl. No.: 13/511,967

(22) PCT Filed: Nov. 30, 2010

(86) PCT No.: PCT/JP2010/071318
§ 371 (c)(1),
(2), (4) Date: May 24, 2012

(87) PCT Pub. No.: WO2011/065554
PCT Pub. Date: Jun. 3, 2011

(65) Prior Publication Data
US 2012/0293475 A1   Nov. 22, 2012

(30) Foreign Application Priority Data

Nov. 30, 2009   (JP) .................. 2009-272682

(51) Int. Cl.
| | | |
|---|---|---|
| G06F 3/038 | (2013.01) | |
| G09G 5/00 | (2006.01) | |
| H01L 27/146 | (2006.01) | |
| G09G 3/36 | (2006.01) | |

(52) U.S. Cl.
CPC ........ *H01L 27/14609* (2013.01); *G09G 3/3648* (2013.01); *G09G 2320/0233* (2013.01); *G09G 2360/141* (2013.01); *G09G 2360/148* (2013.01)

(58) Field of Classification Search
USPC ................. 345/156, 173–184, 204, 207, 690; 178/18.01–18.09, 19.01–19.04
See application file for complete search history.

(56) References Cited

U.S. PATENT DOCUMENTS

| | | |
|---|---|---|
| 2005/0045881 A1 | 3/2005 | Nakamura et al. |
| 2007/0215969 A1 | 9/2007 | Koide et al. |
| 2008/0203279 A1 | 8/2008 | Kobashi |
| 2008/0278667 A1* | 11/2008 | Kobashi ................. 349/116 |
| 2010/0059660 A1 | 3/2010 | Satoh et al. |
| 2010/0193804 A1* | 8/2010 | Brown et al. ............ 257/84 |
| 2010/0238135 A1 | 9/2010 | Brown et al. |

FOREIGN PATENT DOCUMENTS

| | | |
|---|---|---|
| JP | 2006-3857 | 1/2006 |
| JP | 2007-233027 | 9/2007 |

(Continued)

OTHER PUBLICATIONS

Search Report mailed Jan. 11, 2011, directed to International Patent Application No. PCT/JP2010/071318; 4 pages.

*Primary Examiner* — Kumar Patel
*Assistant Examiner* — Insa Sadio
(74) *Attorney, Agent, or Firm* — Keating & Bennett, LLP

(57) ABSTRACT

Provided is a display device that has excellent accuracy in image capturing by improving linearity of sensitivity characteristics of a photodiode. An optical sensor provided on an active matrix substrate of the display device includes; a photodiode (D1a) for receiving incident light; a reset signal line (RSTa) for supplying a reset signal RST to the optical sensor; a readout signal line (RWSa) for supplying a readout signal RWS to the optical sensor; and a sensor switching element (M1a) for reading out a photoelectric current output from the photodiode (D1a), according to the readout signal, during a period from the supply of the reset signal to the supply of the readout signal. A potential VLS of a light shielding film (LS) provided on a back side of the photodiode (D1a) is caused to be a high level potential during a period that at least partially overlaps a period while the reset signal is supplied.

4 Claims, 15 Drawing Sheets

(56) References Cited

FOREIGN PATENT DOCUMENTS

| JP | 2009-540628 | 11/2009 |
|---|---|---|
| WO | WO-2007/145346 | 12/2007 |
| WO | WO-2007/145347 | 12/2007 |
| WO | WO-2008/096892 | 8/2008 |
| WO | WO-2008/143216 | 11/2008 |
| WO | WO-2008/156023 | 12/2008 |

* cited by examiner

DISPLAY DEVICE

REFERENCE TO RELATED APPLICATIONS

This application is a national stage application under 35 USC 371 of International Application No. PCT/JP2010/071318, filed Nov. 30, 2010, which claims priority from Japanese Patent Application No. 2009-272682, filed Nov. 30, 2009, the entire contents of which are incorporated herein by reference.

FIELD OF THE INVENTION

The present invention relates to a display device, and particularly relates to a display device provided with an optical sensor in a pixel region.

BACKGROUND OF THE INVENTION

Recently, in a display device typified by a liquid crystal display device, an optical sensor is mounted in some cases for automatically adjust brightness of its display screen according to intensity of light around the display device. A display device in which a plurality of optical sensors are provided in matrix is known as well. In this display device, the plurality of optical sensors function as one area sensor so as to capture an image on a side to an observer.

The mounting of the optical sensor in the display device can be achieved by mounting an optical sensor as a discrete component on the display panel. Alternatively, the optical sensor may be formed monolithically with an active matrix substrate, through a process of forming active elements (TFTs) or peripheral circuits.

Among these, in the field of the display device for portable terminal devices in particular, the optical sensor is required to be formed monolithically with the active matrix substrate, from the viewpoint of reducing the number of components and reducing the size of the display device. As the optical sensor formed monolithically, for example, a photodiode formed of a silicon film is known (see, e.g., JP2006-3857A).

Here, the following explains the conventional photodiode (optical sensor), while referring to FIG. 20. FIG. 20 is a cross-sectional view showing a configuration of a conventional liquid crystal display panel provided with a photodiode. As shown in FIG. 20, a photodiode 51 is a PIN diode having a lateral structure, and is formed monolithically with an active matrix substrate 51 that composes a liquid crystal display panel.

As shown in FIG. 20, the photodiode 51 is provided with a silicon film 60. The silicon film 60 is formed on a glass substrate 52 as a base substrate of an active matrix substrate 50 simultaneously with a thin film transistor (TFT) functioning as an active element, through a process for forming the thin film transistor (TFT). In the silicon film 60, an n-type semiconductor region (n-layer) 51a, an intrinsic semiconductor region (i-layer) 51b, and a p-type semiconductor region (p-layer) 51c are provided in the stated order in a planar direction. The i-layer 51b becomes a photodetecting region of the photodiode 51.

In a layer below the photodiode 51, a light shielding film 53 for blocking illumination light from a backlight device (not shown) is provided. The light shielding film 53 is covered with an insulative basecoat 54. The light shielding film 53 is usually made of a metal material. The conventional light shielding film 53 is in an electrically floating state, being insulated from the surroundings. Further, the photodiode 51 is covered with interlayer insulation films 55 and 56.

It should be noted that in FIG. 20, "57" indicates a line connected to an n-layer 51a, and "58" indicates a line connected to a p-layer 51c. "59" indicates a flattening film, and "61" indicates a protective film. "62" indicates a liquid crystal layer. As to a filter substrate 63, only an outline is illustrated.

SUMMARY OF THE INVENTION

Incidentally, in the example shown in FIG. 20, since the light shielding film 53 made of a metal is arranged below the photodiode 51, output characteristics of the photodiode 51 fluctuate with potential fluctuations of the light shielding film 53. Besides, the potential of the light shielding film 53 varies in a manner identical to that of the potential of the p-layer 51c of the photodiode. However, the light shielding film 53 contains fixed charges captured in the formation process, and different amounts of the fixed charges result in variations of the potentials of the light shielding films 53. This leads to a problem that the linearity of sensitivity characteristics of the photodiode deteriorates particularly in a low illuminance region or in a high illuminance region.

It is an object of the present invention to solve the above-described problem and improve the linearity of the sensitivity characteristics of the photodiode, and thereby to provide a display device having excellent accuracy in capturing images.

In order to achieve the above-described object, the display device according to the present invention is a display device that includes an optical sensor on an active matrix substrate, wherein the optical sensor includes: a photodetecting element for receiving incident light; a reset signal line for supplying a reset signal to the optical sensor; a readout signal line for supplying a readout signal to the optical sensor; and a sensor switching element for reading out a photoelectric current output from the photodetecting element, according to the readout signal, during a period from the supply of the reset signal to the supply of the readout signal, wherein the display device further includes: a light shielding film provided on a back side of the photodetecting element; and a driving circuit for switching a potential of the light shielding film between a high level potential and a low level potential, wherein the driving circuit causes the light shielding film to have the high level potential during a period that at least partially overlaps a period while the reset signal is supplied to the reset signal line.

According to the present invention, it is possible to provide a display device having excellent accuracy in capturing images, by improving linearity of sensitivity characteristics of the photodiode.

DETAILED DESCRIPTION OF THE INVENTION

Figure 1:
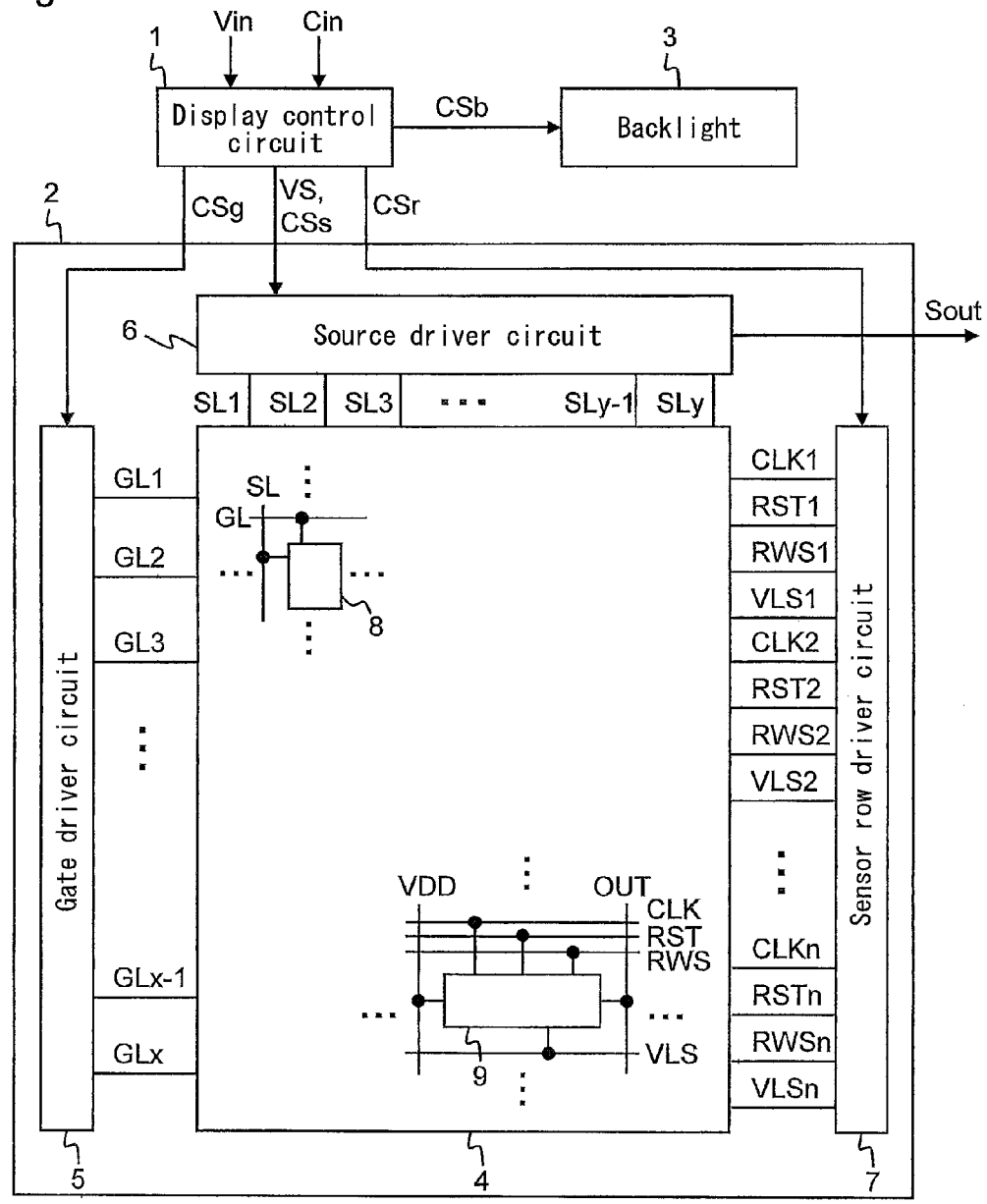
FIG. 1 is a block diagram showing a configuration of a display device according to an embodiment of the present invention.

A display device according to one embodiment of the present invention is a display device that includes an optical sensor on an active matrix substrate, wherein the optical sensor includes: a photodetecting element for receiving incident light; a reset signal line for supplying a reset signal to the optical sensor; a readout signal line for supplying a readout signal to the optical sensor; and a sensor switching element for reading out a photoelectric current output from the photodetecting element, according to the readout signal, during a period from the supply of the reset signal to the supply of the readout signal, wherein the display device further includes: a light shielding film provided on a back side of the photodetecting element; and a driving circuit for switching a potential of the light shielding film between a high level potential and a low level potential, wherein the driving circuit causes the light shielding film to have the high level potential during a period that at least partially overlaps a period while the reset signal is supplied to the reset signal line.

This display device includes the driving circuit that switches the potential of the light shielding film provided on a back side of the photodetecting element between the high level potential and the low level potential, and by causing the potential of the light shielding film to be the high level potential during the period that at least partially overlaps the period while the reset signal is supplied to the reset signal line, a state can be obtained in which free electrons and positive holes easily migrate between an anode and a cathode of the photodetecting element. Thus, a photoelectric current smoothly flows through the photodetecting element, whereby the linearity of sensitivity characteristics of the photodetecting element is improved. As a result, the display device having excellent accuracy in image capturing can be provided.

The photodetecting element is preferably a diode having a PIN structure. Further, the following formula is preferably satisfied:

$$V_{LS\_H} \geq V_{RST\_H} + V_{th\_p}$$

where $V_{LS\_H}$ represents the high level potential of the light shielding film, $V_{RST\_H}$ represents a high level potential of the reset signal, and $V_{th\_p}$ represents a threshold voltage of an assumed p-channel MOS transistor where a p-layer of the photodiode is a source-drain region and the light shielding film is a gate electrode. Still further, the following is preferably satisfied:

$$V_{RST\_L} + V_{th\_p} \leq V_{LS\_L} \leq V_C + V_{th\_n}$$

where $V_{LS\_L}$ represents the low level potential of the light shielding film, $V_{RST\_L}$ represents a low level potential of the reset signal, $V_C$ represents a potential in an n-layer of the photodiode, $V_{th\_p}$ represents a threshold voltage of an assumed p-channel MOS transistor where a p-layer of the photodiode is a source-drain region and the light shielding film is a gate electrode, and $V_{th\_n}$ represents a threshold value of an assumed n-channel MOS transistor where the n-layer of the photodiode is a source-drain region and the light shielding film is a gate electrode.

The driving circuit preferably causes the light shielding film to have the high level potential during a period that overlaps an entirety of the period while the reset signal is supplied to the reset signal line.

Hereinafter, a more specific embodiment of the present invention is explained with reference to drawings.

FIG. 1 is a block diagram showing a configuration of a display device according to an embodiment of the present invention. A display device shown in FIG. 1 includes a display control circuit 1, a display panel 2, and a backlight 3. The display panel 2 includes a pixel region 4, a gate driver circuit 5, a source driver circuit 6, and a sensor row driver circuit 7. The pixel region 4 includes a plurality of display pixel circuits 8 and a plurality of sensor pixel circuits 9. This display device has a function of displaying images on the display panel 2 and a function of detecting light incident on the display panel 2. In the following description, x represents an integer of 2 or more, y represents a multiple of 3, and m and n represent even integers, respectively, while the display device has a frame rate of 60 frames per second.

To the display device shown in FIG. 1, a video signal Vin and a timing control signal Cin are supplied from outside. Based on these signals, the display circuit 1 outputs a video signal VS and control signals CSg, CSs, and CSr to the display panel 2, and outputs a control signal CSb to the backlight 3. The video signal VS may be identical to the video signal Vin, or alternatively, a signal obtained by subjecting the video signal Vin to signal processing.

The backlight 3 is a light source for irradiating the display panel 2 with light. More specifically, the backlight 3 is provided on a back side of the display panel 2, and irradiates a back face of the display panel 2 with light. The backlight 3 is turned on when the control signal CSb is at a high level, while it is turned off when the control signal CSb is at a low level.

In the pixel region 4 of the display panel 2, the display pixel circuits 8, which are (x×y) in number, and the sensor pixel circuits 9, which are (n×m/2) in number, are provided two-dimensionally, respectively. More specifically, x gate lines GL1 to GLx, and y source lines SL1 to Sly are provided in the pixel region 4. The gate lines GL1 to GLx are arranged in parallel with one another, and the source lines SL1 to SLy are arranged in parallel with one another, so as to cross the gate lines GL1 to GLx perpendicularly. The (x×y) display pixel circuits 8 are arranged in the vicinities of intersections of the gate lines GL1 to GLx and the source lines SL1 to SLy. Each display pixel circuit 8 is connected to one gate line GL and one source line SL. The display pixel circuits 8 are classified into those for displaying red, those for displaying green, and those for display blue. Every three of the display pixel circuits 8 that belong to these three types, respectively, are aligned in a direction in which the gate lines GL1 to GLx are extended, and constitute one color pixel.

In the pixel region 4, n clock lines CLK1 to CLKn, n reset lines RST1 to RSTn, and n readout lines RWS1 to RWSn are provided in parallel with the gate lines GL1 to GLx. Further, in the pixel region 4, other signal lines and power source lines (not shown) are provided in parallel with the gate lines GL1 to GLx in some cases. When readout from the sensor pixel circuits 9 is carried out, m source lines selected from the source lines SL1 to SLy are used as power source lines VDD1 to VDDm, and m other lines are used as output lines OUT1 to OUTm.

It should be noted that n light shielding film signal lines VLS1 to VLSn are provided in parallel with the clock lines CLK1 to CLKn. The light shielding film signal lines VLS1 to VLSn are connected to light shielding films (to be described later) provided in the sensor pixel circuits 9.

Figure 2:
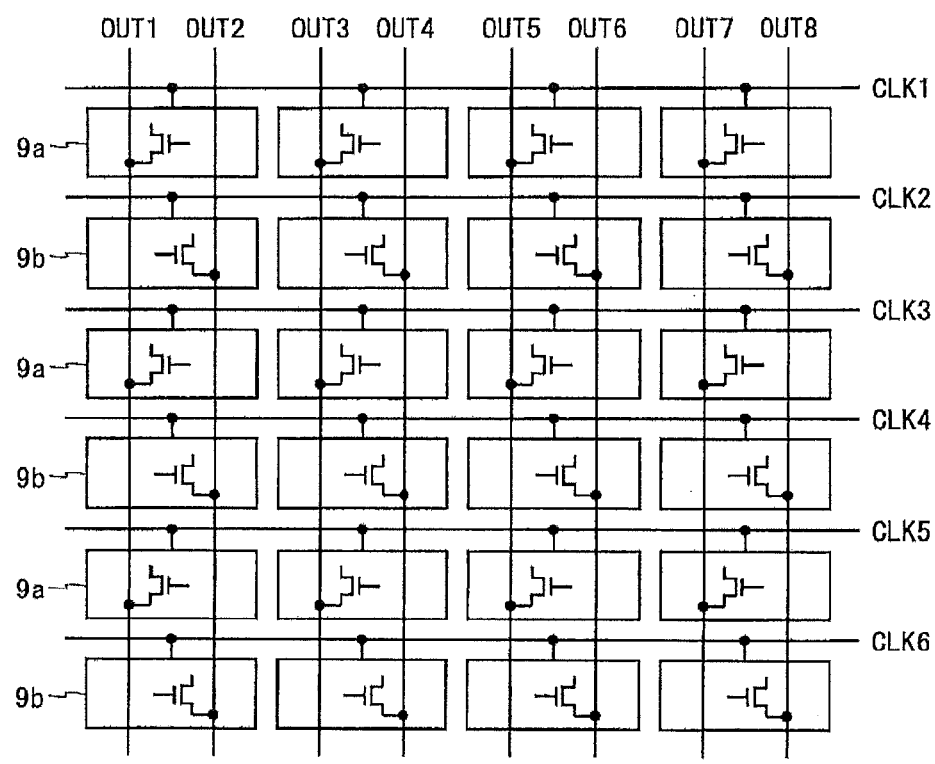
FIG. 2 shows an arrangement of sensor pixel circuits in a display panel included in the display device shown in FIG. 1.

FIG. 2 shows an arrangement of the sensor pixel circuits 9 in the pixel region 4. Among the (n×m/2) sensor pixel circuits 9, there are include first sensor pixel circuits 9a for detecting light that is incident during a period while the backlight 3 is in an ON state, and second sensor pixel circuits 9b for detecting light that is incident during a period while the backlight 3 is in an OFF state. The number of the first sensor pixel circuits 9a and the number of the second sensor pixel circuits 9b are the same. In the case of FIG. 2, (n×m/4) first sensor pixel circuits 9a are arranged in the vicinities of intersections of the odd-number-th clock lines CLK1 to CLKn−1 and the odd-number-th output lines OUT1 to OUTm−1. (n×m/4) second sensor pixel circuits 9b are arranged in the vicinities of intersections of the even-number-th clock lines CLK2 to CLKn and the even-number-th output lines OUT2 to OUTm. In this way, the display panel 2 includes the plurality of output lines OUT1 to OUTm for transmitting output signals of the first sensor pixel circuits 9a and output signals of the second sensor pixel circuits 9b, and the first sensor pixel circuits 9a and the second sensor pixel circuits 9b are connected to different output lines depending on the types.

The gate driver circuit 5 drives the gate lines GL1 to GLx. More specifically, the gate driver circuit 5 sequentially selects the gate lines GL1 to GLx one by one based on the control signal CSg, and applies a high level potential to the selected gate line, while applying a low level potential to the other gate lines. By doing so, y display pixel circuits 8 connected to the selected gate line are selected at once.

The source driver circuit 6 drives the source lines SL1 to SLy. More specifically, based on the control signal CSs, the source driver circuit 6 applies potentials according to the video signal VS to the source lines SL1 to SLy, respectively. Here, the source driver circuit 6 may perform line-sequential driving, or alternatively, dot-sequential driving. The potentials applied to the source lines SL1 to SLy are written in y display pixel circuits 8 selected by the gate driver circuit 5. In this way, by writing potentials corresponding to the video signals VS into all of the display pixel circuits 8, respectively, using the gate driver circuit 5 and the source driver circuit 6, desired images can be displayed on the display panel 2.

The sensor row driver circuit 7 drives the clock lines CLK1 to CLKn, the reset lines RST1 to RSTn, the readout lines RWS1 to RWSn, and the like. More specifically, based on the control signal CSr, the sensor row driver circuit 7 applies a high level potential and a low level potential to the clock lines CLK1 to CLKn at timings shown in FIG. 4 (details will be described later). Based on the control signal CSr, the sensor row driver circuit 7 selects (n/2) or two reset lines out of the reset lines RST1 to RSTn, and applies a high level potential for resetting to the selected reset lines, while applying a low level potential to the other reset lines. Thus, (n×m/4) or m sensor pixel circuits 9 connected to the reset lines to which the high level potential is applied are reset at once.

Based on the control signal CSr, the sensor row driver circuit 7 sequentially selects two adjacent readout lines out of the readout lines RWS1 to RWSn, and applies a high level potential for readout to the selected readout lines, while applying a low level potential for readout to the other readout lines. This causes m sensor pixel circuits 9 connected to the selected two readout lines to become ready to be read out at once. Here, the source driver circuit 6 applies a high level potential to the power source lines VDD1 to VDDm. This causes signals corresponding to amounts of light detected by the respective sensor pixel circuits 9 (hereinafter referred to as sensor signals) to be output from the m sensor pixel circuits 9 ready to be read out to the output lines OUT1 to OUTm.

The source driver circuit 6 includes a differential circuit (not shown) for determining a difference between an output signal of the first sensor pixel circuit 9a and an output signal of the second sensor pixel circuit 9b. The source driver circuit 6 amplifies the difference of light amounts determined by the differential circuit, and outputs the amplified signal as a sensor output Sout to the outside of the display panel 2. In this way, by reading out sensor signals from all the sensor pixel circuits 9 by using the source driver circuit 6 and the sensor row driver circuit 7, light incident on the display panel 2 can be detected. The display device shown in FIG. 1 operates in the following manner so as to detect light incident on the display panel 2.

Figure 3:
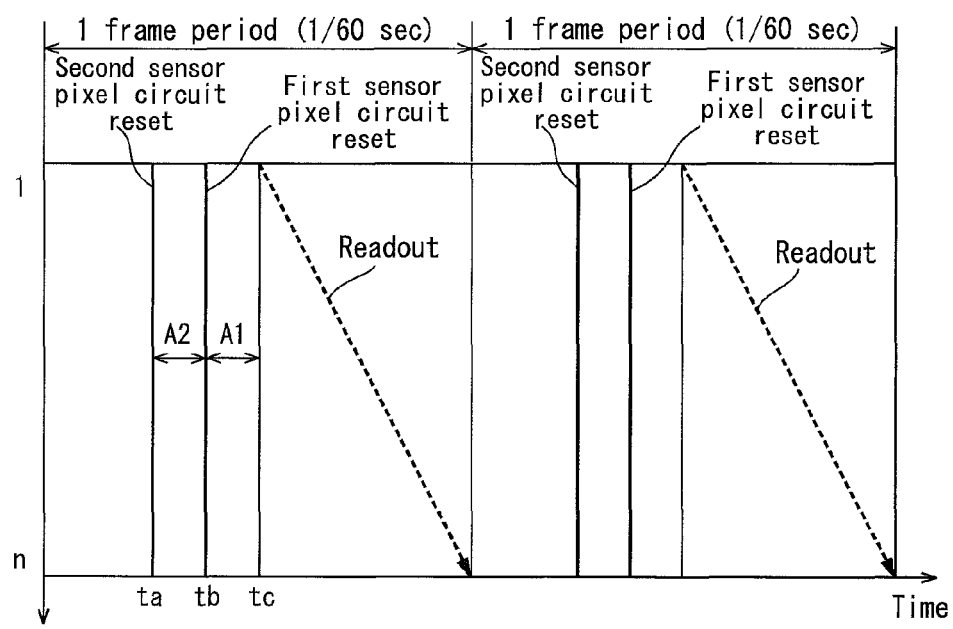
FIG. 3 shows timings for turning on and off a backlight and timings for resetting and readout with respect to sensor pixel circuits when one cycle of driving is carried out in the display device according to FIG. 1.

FIG. 3 shows timings of turning on and off the backlight 3 and timings of resetting and readout with respect to the sensor pixel circuits 9. The backlight 3 is turned on once, for a predetermined period of time, during one frame period, and is turned off during the other period. More specifically, the backlight 3 is turned on at a time tb in one frame period, and is turned off at a time tc. All the first sensor pixel circuits 9a are reset at the time tb, and all the second sensor circuits 9b are reset at a time ta.

The first sensor pixel circuits 9a detect light incident during a period A1 from the time tb to the time tc (backlight-on period of the backlight 3). The second sensor pixel circuits 9b detect light incident during a period A2 from the time ta to the time tb (backlight-off period of the backlight 3). The period A1 and the period A2 have the same duration. The readout from the first sensor pixel circuits 9a and the readout from the second sensor pixel circuits 9b are performed in parallel, line-sequentially, after the time tc. It should be noted that in FIG. 3 the readout from the sensor pixel circuit 9 is completed during one frame period, but this may be completed by the time when the resetting is performed with respect to the first sensor pixel circuit 9a in the next frame period.

Figure 4:
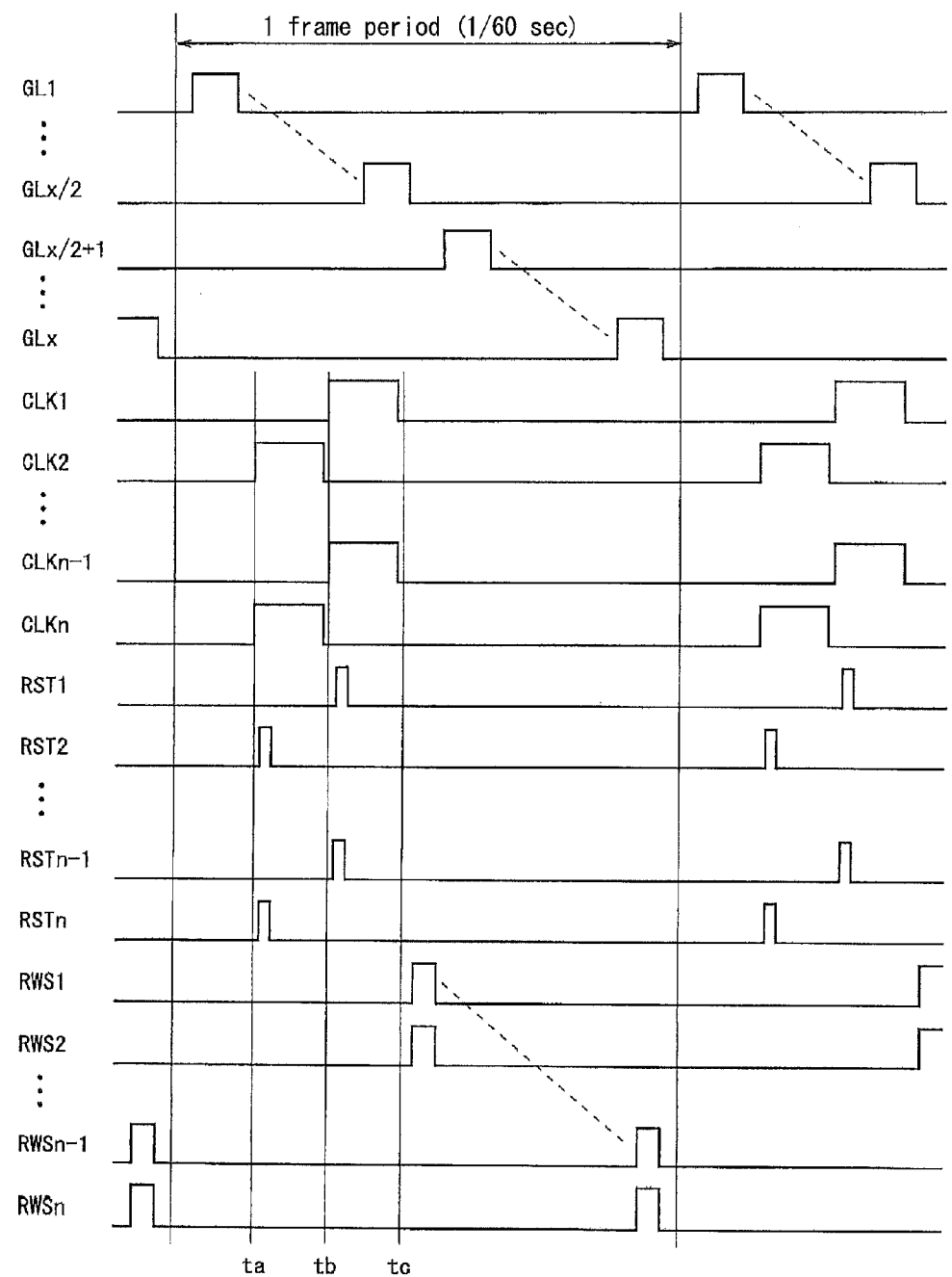
FIG. 4 is a signal waveform diagram of a display panel when one cycle of driving is carried out in the display device shown in FIG. 1.

FIG. 4 is a signal waveform diagram of the display panel 2. As shown in FIG. 4, the potentials of the gate lines GL1 to GLx sequentially rise to the high level once each in one frame period, for a predetermined of time each. The potential of the odd-number-th clock line CLK1 to CLKn−1 rises to the high level once in one frame period, during the period A1 (more specifically, from the time tb to a little before the time tc). The potentials of the even-number-th clock lines CLK2 to CLKn rise to the high level once in one frame period, during the period A2 (more specifically, from the time ta to a little before the time tb). The potentials of the odd-number-th reset lines RST1 to RSTn−1 rise to the high level once in one frame period, for a predetermined period at the beginning of the period A1. The potentials of the even-number-th reset lines RST2 to RSTn rise to the high level once in one frame period, for a predetermined period at the beginning of the period A2. Two each of the readout lines RWS1 to RWSn are paired, and the potentials of the (n/2) pairs of the readout lines sequentially rise to the high level after the time tc, for a predetermined period each.

Figure 5:
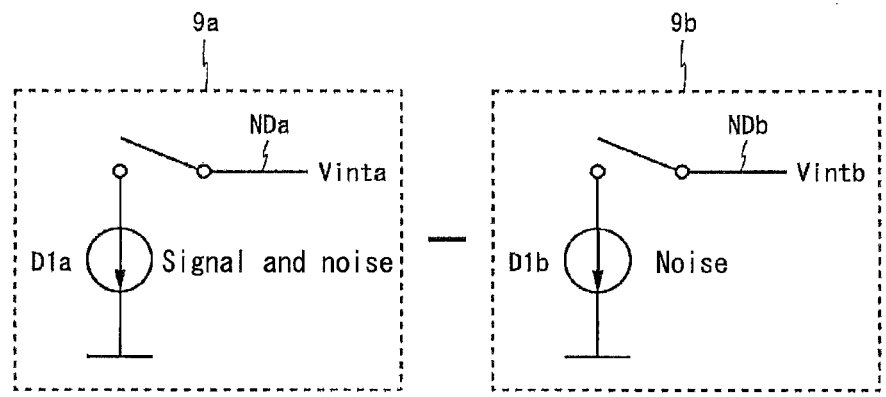
FIG. 5 shows a schematic configuration of a sensor pixel circuit included in the display device shown in FIG. 1.

FIG. 5 shows a schematic configuration of the sensor pixel circuits 9. As shown in FIG. 5, the first sensor pixel circuit 9a includes one photodiode D1a and one accumulation node NDa. The photodiode D1a draws out electric charges according to an amount of light (signal+noise) incident thereon while the backlight 3 is in an ON state, from the accumulation node NDa. The second sensor pixel circuit 9b includes one photodiode D1b and one accumulation node NDb, as is the case with the first sensor pixel circuit 9a. The photodiode D1b draws out electric charges according to an amount of light (noise) incident thereon while the backlight 3 is in an OFF state, from the accumulation node NDb. From the first sensor pixel circuit 9a, a sensor signal according to an amount of light that is incident during a detection period when the backlight 3 is in an ON state is read out. From the second sensor pixel circuit 9b, a sensor signal according to an amount of light that is incident during a detection period when the backlight 3 is in an OFF state is read out. A difference between an output signal of the first sensor pixel circuit 9a and an output signal of the second sensor pixel circuit 9b is determined with the differential circuit included in the source driver circuit 6, whereby a difference between the amount of light during the backlight-on period and the amount of light during the backlight-off period can be determined.

It should be noted that the number of the sensor pixel circuits 9 provided in the pixel region 4 may be arbitrary. It is, however, preferable that the first sensor pixel circuits 9a and the second sensor pixel circuits 9b are connected to different output lines. For example, in the case where (n×m) sensor pixel circuits 9 are provided in the pixel region 4, n first sensor pixel circuits 9a may be connected to the odd-number-th output lines OUT1 to OUTm−1, respectively, and n second sensor pixel circuits 9b may be connected to the even-number-th output lines OUT2 to OUTm, respectively. In this case, the readout from the sensor pixel circuits 9 is carried out row by row. Alternatively, the same number (i.e., (x×y/3)) of the sensor pixel circuits 9 as the number of the color dots may be provided in the pixel region 4. Alternatively, a smaller number (e.g., one several-th to one several tenths of the color dots) of the sensor pixel circuits 9, than the number of color dots, may be provided in the pixel region 4.

In this way, a display device according to an embodiment of the present invention is a display device in which a plurality of photodiodes (optical sensors) are arranged in the pixel region 4, and the display device includes the display panel 2 and the sensor row driver circuit 7 (driving circuit), wherein the display panel 2 includes a plurality of the display pixel circuits 8 and a plurality of the sensor pixel circuits 9, and the sensor row driver circuit 7 outputs, to the sensor pixel circuits 9, a clock signal CLK (control signal) that indicates a detection period in the backlight-on period and a detection period in the backlight-off period. Hereinafter, details of the sensor pixel circuit 9 included in this display device are explained. In the following explanation, signals on signal lines are referred to with the same names as the names of the signal lines, so that the signals can be distinguished (for example, the signal on the clock line CLKa is referred to as "a clock signal CLKa").

The first sensor pixel circuit 9a is connected to a clock line CLKa, a reset line RSTa, a readout line RWSa, a power source line VDDa, and an output line OUTa. The second sensor pixel circuit 9b is connected to a clock line CLKb, a reset line RSTb, a readout line RWSb, a power source line VDDb, and an output line OUTb. It should be noted that the second sensor pixel circuit 9b has the same configuration and operates in the same manner as the first sensor pixel circuit 9a. Therefore, explanation about the second sensor pixel circuit 9b is omitted as appropriate.

Figure 6:
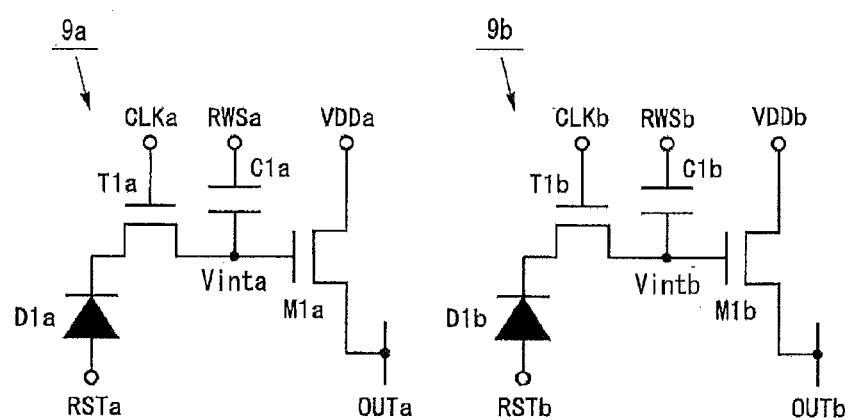
FIG. 6 is a circuit diagram of a sensor pixel circuit.

FIG. 6 is a circuit diagram of a pixel circuit according to the present embodiment. As shown in FIG. 6, the first sensor pixel circuit 9a includes transistors T1a and M1a, a photodiode D1a, and a capacitor C1a. The second sensor pixel circuit 9b includes transistors T1b, M1b, a photodiode D1b, and a capacitor C1b. The transistors T1a, M1a, T1b, and M1b are N-type TFTs (thin film transistors).

In the first sensor pixel circuit 9a, an anode of the photodiode D1a is connected to the reset line RSTa, and a cathode thereof is connected to a source of the transistor T1a. A gate of the transistor T1a is connected to the clock line CLKa, and a drain thereof is connected to a gate of the transistor M1a. A drain of the transistor M1a is connected to the power source line VDDa, and a source thereof is connected to the output line OUTa. The capacitor C1a is provided between the gate of the transistor M1a and the readout line RWSa. In the first sensor pixel circuit 9a, a node connected to the gate of the transistor M1a functions as an accumulation node in which charges corresponding to an amount of light detected are accumulated, and the transistor M1a functions as a readout transistor. The second sensor pixel circuit 9b has the same configuration as that of the first sensor pixel circuit 9a.

Figure 7:
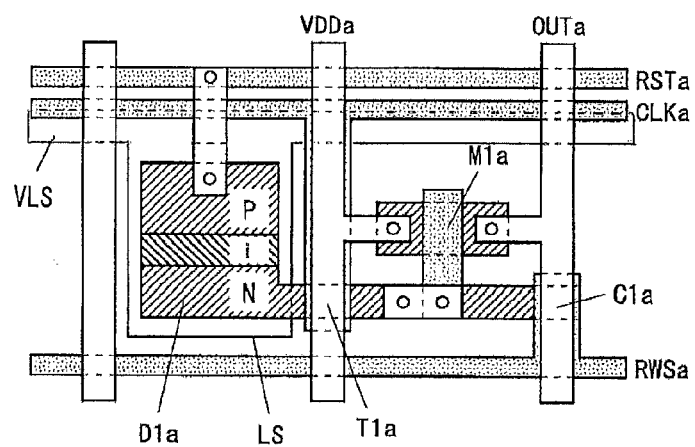
FIG. 7 is a layout diagram of the sensor pixel circuit shown in FIG. 6.

FIG. 7 is a layout diagram of the first sensor pixel circuit 9a. As shown in FIG. 7, the first sensor pixel circuit 9a is obtained by forming a light shielding film LS, a semiconductor layer (hatched part), a gate line layer (dotted part), and a source line layer (void part) in the stated order on a glass substrate. At positions where the semiconductor layer and the source line layer are connected, and positions where the gate line layer and the source line layer are connected, contacts (indicated by void circles) are provided.

With respect to the first sensor pixel circuit 9a and the second sensor pixel circuit 9b, the light shielding film LS prevents light from the backlight 3 from being directly incident on the photodiodes D1a and D1b. The light shielding film LS is formed of a light shielding metal thin film made of, for example, molybdenum. The light shielding films LS of the first sensor pixel circuits 9a are connected electrically with one another via the light shielding signal lines VLS. The light shielding films LS of the second sensor pixel circuits 9b are also connected electrically with one another via the light shielding signal lines VLS. It should be noted that the light shielding film signal lines VLS may be formed of a material different from the material of the light shielding films LS, or may be formed of the same material as that of the light shielding films LS. In the former case, the light shielding film signal lines VLS may be formed in a layer different from that of the light shielding films LS, and the light shielding films LS and the light shielding film signal lines VLS may be connected via contact holes. In the latter case, when the light shielding films LS are formed by patterning, the light shielding film signal lines VLS may be formed in a continuous pattern at the same time. It should be noted that the example shown in FIG. 7 is the latter case.

The transistors T1a and M1a are formed with the semiconductor layer and the gate line layer that are arranged so as to cross each other. The photodiode D1a is formed with the semiconductor layers of the P-layer, the I-layer, and the N-layer that are juxtaposed. The capacitor C1a is formed with the semiconductor layer and the gate line layer overlapping each other. The light shielding film LS is made of a metal, and prevents light coming from a back side of the substrate from being incident on the photodiode D1a. The second sensor pixel circuit 9b is laid out in the same manner as that of the first sensor pixel circuit 9a. It should be noted that the first and second sensor pixel circuits 9a and 9b may be laid out in a manner other than the above-described manner.

Figure 8:
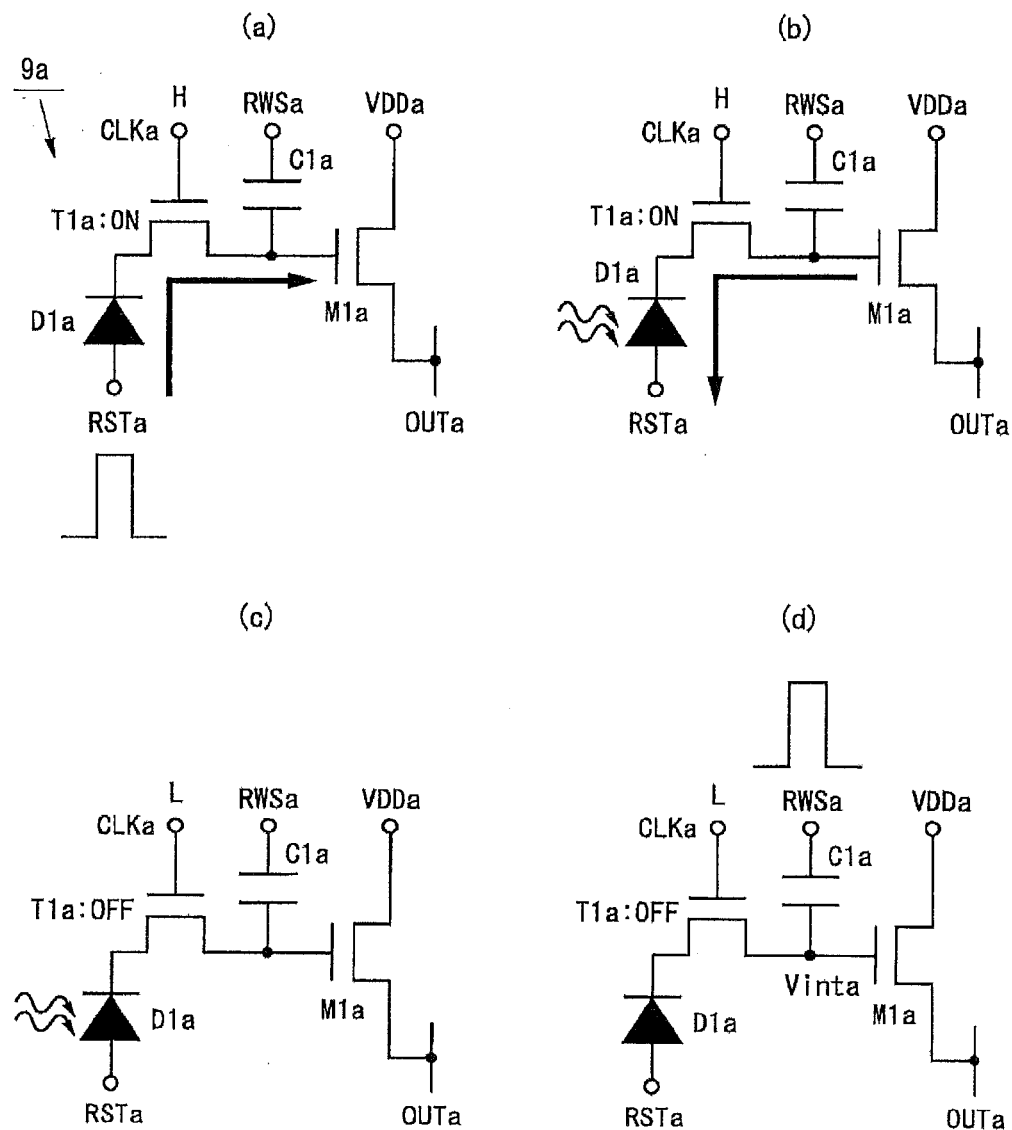
FIG. 8 shows operations of the sensor pixel circuit shown in FIG. 6

FIG. 8 shows operations of the first sensor pixel circuit 9a. The first sensor pixel circuit 9a performs (a) resetting, (b) accumulation, (c) retention, and (d) readout in one frame period.

Figure 9:
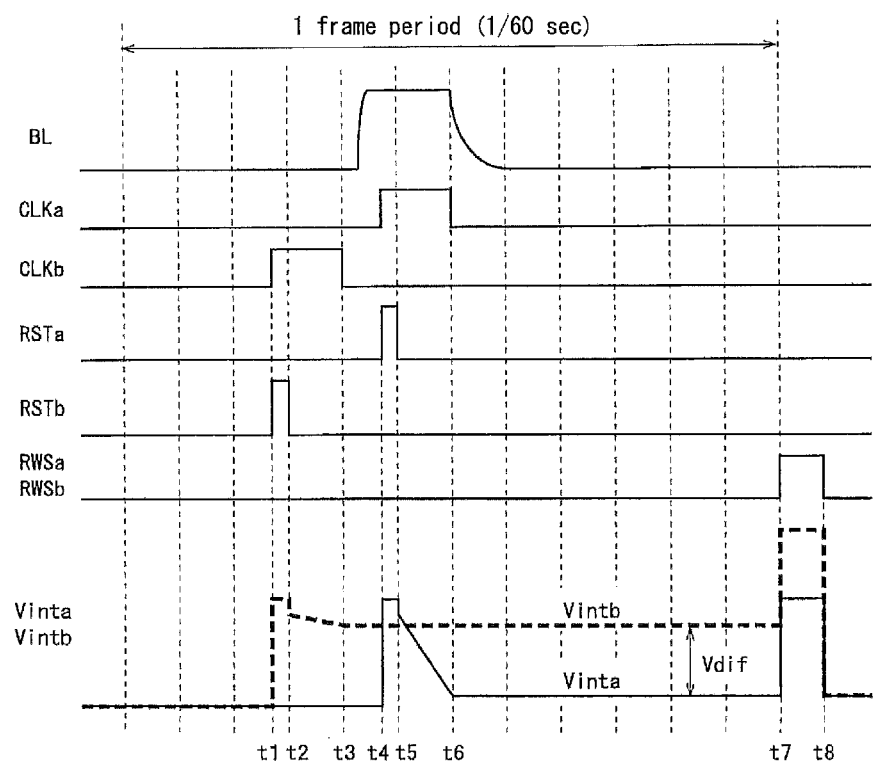
FIG. 9 is a signal waveform diagram of the sensor pixel circuit shown in FIG. 6.

FIG. 9 is a signal waveform diagram of the first sensor pixel circuit 9a and the second sensor pixel circuit 9b. In FIG. 9, "BL" indicates illuminance of the backlight 3, "Vinta" indicates a potential of the accumulation node of the first sensor pixel circuit 9a (gate potential of the transistor M1a), and "Vintb" indicates a potential of the accumulation node of the second sensor pixel circuit 9b (gate potential of the transistor M1b). As to the first sensor pixel circuit 9a, the period from the time t4 to the time t5 is a reset period, the period from the time t5 to the time t6 is an accumulation period, the period from the time t6 to the time t7 is a retention period, and the period from the time t7 to the time t8 is a readout period. As to the second sensor pixel circuit 9b, the period from the time t1 to the time t2 is a reset period, the period from the time t2 to the time t3 is an accumulation period, the period from the time t3 to the time t7 is a retention period, and the period from the time t7 to the time t8 is a readout period.

During the reset period for the first sensor pixel circuit 9a, the clock signal CLKa rises to a high level, the readout signal RWSa falls to a low level, and the reset signal RSTa rises to a high level for resetting. Here, the transistor T1a is turned on. Therefore, an electric current (forward current of the photodiode D1a) flows from the reset line RSTa via the photodiode D1a and the transistor T1a to the accumulation node ((a) of FIG. 8), whereby the potential Vinta is reset to a predetermined level.

During the accumulation period for the first sensor pixel circuit 9a, the clock signal CLKa is at the high level, and the reset signal RSTa and the readout signal RWSa are at low levels. Here, the transistor T1a is turned on. When light is incident on the photodiode D1a in this state, an electric current (photoelectric current of the photodiode D1a) flows from the accumulation node via the transistor T1a and the photodiode D1a to the reset line RSTa, and charges are drawn out of the accumulation node ((b) of FIG. 8). Therefore, the potential Vinta falls by a degree according to an amount of light incident during a period while the clock signal CLKa is at the high level (backlight-on period of the backlight 3).

During the retention period for the first sensor pixel circuit 9a, the clock signal CLKa, the reset signal STa, and the readout signal RWSa are at low levels. Here, the transistor T1a is turned off. Here, even if light is incident on the photodiode D1a, the potential Vinta does not change, since the transistor T1a is in an OFF state and the photodiode D1a and the gate of the transistor M1 are electrically disconnected ((c) of FIG. 8).

During the readout period for the first sensor pixel circuit 9a, the clock signal CLKa and the reset signal RSTa are at low levels, and the readout signal RWSa rises to a high level for readout. Here, the transistor T1a is turned off. Here, the potential Vinta rises by (Cqa/Cpa) time an amount of rise of the potential of the readout signal RWSa (where Cpa represents a value of a capacitance of the first sensor pixel circuit 9a as a whole, and Cqa represents a value of a capacitance of the capacitor C1a). The transistor Mia forms a source follower amplifying circuit that has, as its load, a transistor (not shown) included in the source driver circuit 6, and drives the output line OUTa according to the potential Vinta ((d) of FIG. 8).

The second sensor pixel circuit 9b operates in the same manner as the first sensor pixel circuit 9a. The potential Vintb is reset to a predetermined level during the reset period; during the accumulation period, the potential Vintb falls by a degree according to an amount of light that is incident during a period while the clock signal CLKb is at a high level (backlight-off period of the backlight 3); and during the retention period, it does not change. During the readout period, the potential Vintb rises by (Cqb/Cpb) time an amount of rise of the potential of the readout signal RWSb (where Cpb represents a value of a capacitance of the second sensor pixel circuit 9b as a whole, and Cqb represents a value of a capacitance of the capacitor C1b). The transistor M1b drives the output line OUTb according to the potential Vintb.

As described above, the first sensor pixel circuit 9a according to the present embodiment includes one photodiode D1a (optical sensor), one accumulation node in which charges corresponding to an amount of light detected are accumulated, the transistor M1a (readout transistor) having a control terminal connected to the accumulation node, and the transistor T1a (switching element for retention) that is provided on a path of an electric current flowing through the photodiode D1a and is turned on/off according to the clock signal CLK (switching element for retention). The transistor T1a is provided between the accumulation node and an end of the photodiode D1a, and the other end of the photodiode D1a is connected to the reset line RSTa. The transistor T1a is turned on during the detection period in the backlight-on period, according to the clock signal CLKa. The second sensor pixel circuit 9b has the same configuration as that of the first sensor pixel circuit 9a, and the transistor T1b included in the second sensor pixel circuit 9b is turned on during the detection period in the backlight-off period.

By thus providing the transistor T1a, which is turned on during the detection period in the backlight-on period, on a path of an electric current flowing through the photodiode D1a, and providing the transistor T1b, which is turned on during the detection period in the backlight-off period, on a path of an electric current flowing through the photodiode D1b, the first sensor pixel circuit 9a and the second sensor pixel circuit 9b are provided so that the first sensor pixel circuit 9a detects light during the detection period in the backlight-on period and retains the detected light amount during the other period, and the second sensor pixel circuit 9b detects light during the detection period in the backlight-off period and retains the detected light amount during the other period.

Therefore, using the first and second sensor pixel circuits 9a and 9b, the amount of light during the backlight-on period and the amount of light during the backlight-off period can be detected individually, and a difference between these can be determined outside the pixel circuits. This makes it possible to provide an input function that is independent from light environments. As compared with the case where amounts of two types of light are detected sequentially by one sensor pixel circuit, the number of times of readout from the sensor pixel circuits can be decreased, whereby the readout speed can be slowed and the power consumption of the device can be decreased. Further, by carrying out the operation for detecting light during the backlight-on period once and the operation for detecting light during the backlight-off period once during one frame period, the degree of freedom in determining the timings of turning on and off the backlight, as well as timings of resetting and readout with respect to the sensor pixel circuits can be increased. Still further, by setting the detection period in the backlight-on period and the detection time in the backlight-off period close to each other, deviations between the detection period in the backlight-on period and the detection period in the backlight-off period can be eliminated, which prevents its following capability with respect to a motion input from fluctuating depending on an input direction. Still further, by determining a difference of a dark current outside the sensor pixel circuits, temperature compensation can be carried out.

The first and second sensor pixel circuits 9a and 9b further include the capacitors C1a and C1b, respectively, which are provided between the accumulation node and the readout line RWSa, and between the accumulation and the readout line RWSb, respectively. Therefore, by applying a readout potential to the readout lines RWSa and RWSb, the potential of the accumulation node is caused to vary, and signals according to the amount of detected light can be read out from the first and second sensor pixel circuits 9a and 9b, respectively.

Further, the display panel 4 further includes a plurality of output lines OUT1 to OUTm that transmit output signals of the first and second sensor pixel circuits 9a and 9b, and the first sensor pixel circuits 9a and the second sensor pixel circuits 9b are connected to the output lines of the different types, respectively. Therefore, the readout from the first sensor pixel circuits 9a and the readout from the second sensor pixel circuits 9b can be carried out in parallel, whereby the readout speed can be decreased and the power consumption of the device can be reduced. Further, the source driver circuit 6 includes the differential circuit for determining a difference between an output signal of the first sensor pixel circuit 9a and an output signal of the second sensor pixel circuit 9b. Therefore, a difference between amounts of light of the two types that are read out in parallel can be determined immediately, and a memory for storing an amount of light detected previously, which is required in the case where amounts of light of the two types are detected sequentially, can be made unnecessary.

Figure 10:
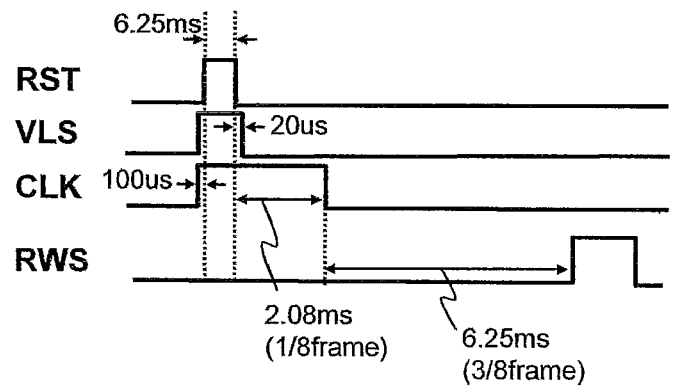
FIG. 10 is an exemplary driving waveform of the sensor pixel circuit shown in FIG. 6.

It should be noted that the first sensor pixel circuit 9a and the second sensor pixel circuit 9b according to the present embodiment are provided with light shielding films LS, which are disposed on back sides of the photodiodes D1a and D1b, respectively. To each of the light shielding film LS of the photodiode D1a and the light shielding film LS of the photodiode D1b, high level potentials are applied, once during one frame period, as shown in FIG. 10. It should be noted that the high level potential is applied to the light shielding film LS of the photodiode D1a from the light shielding film signal line VLS in such a manner that the period of application of this high level potential overlaps the period while the high level potential is applied to the reset line of the first sensor pixel circuit 9a. The high level potential is applied to the light shielding film LS of the photodiode D1b from the light shielding film signal line VLS in such a manner that the period of application of this high level potential overlaps the period while the high level potential is applied to the reset line of the second sensor pixel circuit 9b. In other words, the period while the potential applied to the odd-number-th light shielding film signal lines VLS1 to VLSn−1 is at the high level overlaps the period while the potential applied to the odd-number-th reset lines RST1 to RSTn−1 is at the high level. The period while the potential applied to the even-number-th light shielding film signal lines VLS2 to VLSn is at the high level overlaps the period while the potential applied to the even-number-th reset lines RST2 to RSTn is at the high level.

Figure 11:
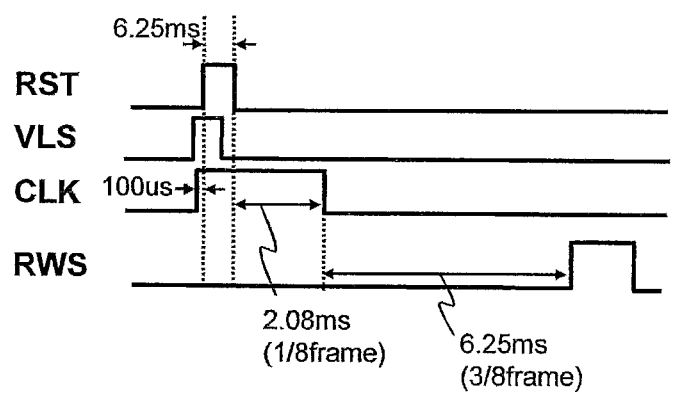
FIG. 11 is an exemplary driving waveform of the sensor pixel circuit shown in FIG. 6.
Figure 12:
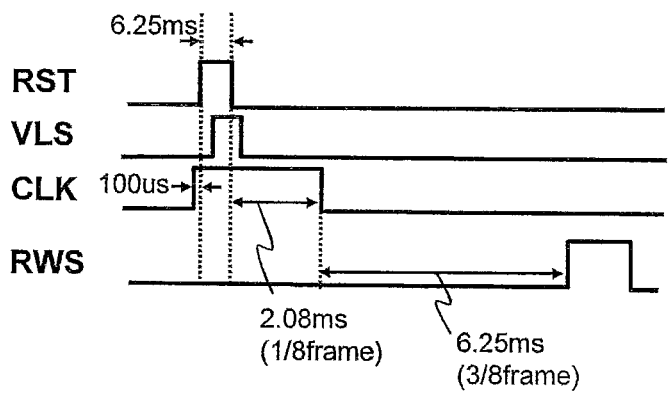
FIG. 12 is an exemplary driving waveform of the sensor pixel circuit shown in FIG. 6.

The period while the high level potential is applied to the light shielding film signal lines VLS1 to VLSn−1 is preferably set so as to completely include the period while the potential applied to the reset lines RST1 to RSTn−1 is at the high level. Besides, the period while the high level potential is applied to the light shielding film signal lines VLS2 to VLSn is preferably set so as to completely include the period while the potential applied to the reset lines RST2 to RSTn is at the high level. For example, in the example shown in FIG. 10, the application of the high level potential $V_{LS\_H}$ to the light shielding film signal line VLS starts slightly before the time when the potential of the reset line RST is switched from the low level to the high level, and the potential of the light shielding film signal line VLS is returned to the low level potential $V_{LS\_L}$ slightly after the time when the potential of the reset line RST is switched from the high level to the low level. However, it is unnecessary that the period while the high level potential is applied to the light shielding film signal line VLS should completely overlap the period while the potential of the reset line RST is at the high level. If these periods at least partially overlap each other, the effect is achieved to some extent. For example, as shown in FIG. 11 or 12, the period while the high level potential is applied to the light shielding film signal line VLS may partially overlap the period while the potential of the reset line RST is at the high level.

It should be noted that the high level potential $V_{LS\_H}$ of the light shielding film signal line VLS preferably satisfies the formula (1) shown below. Besides, the low level potential $V_{LS\_L}$ of the light shielding film signal line VLS preferably satisfies the formula (2) shown below. It should be noted that in the formulae (1) and (2) below, $V_C$ represents a potential in the n-layers of the photodiodes D1a and D1b, $V_{RST\_H}$ represents the high level potential of the reset line RST, and $V_{RST\_L}$ represents the low level potential of the reset line RST. $V_{th\_n}$ represents a threshold voltage of an assumed n-channel MOS transistor where the n-layers of the photodiodes D1a and D1b are the source-drain region and the light shielding film LS is the gate electrode. Likewise, $V_{th\_p}$ represents a threshold voltage of an assumed p-channel MOS transistor where the p-layers re the source-drain region and the light shielding film LS is the gate electrode.

$$V_{LS\_H} \geq V_{RST\_H} + V_{th\_p} \quad (1)$$

$$V_{RST\_L} + V_{th\_p} \leq V_{LS\_L} \leq V_C + V_{th\_n} \quad (2)$$

Thus, by setting the period while the high level potential is applied to the light shielding film signal line VLS substantially in the same period for resetting, an advantage of improving the linearity of the sensor output can be achieved. In other words, by controlling the potential of the light shielding film signal line VLS, the operation mode of the photodiodes D1a and D1b can be controlled. The principles of this is explained below.

Figure 13:
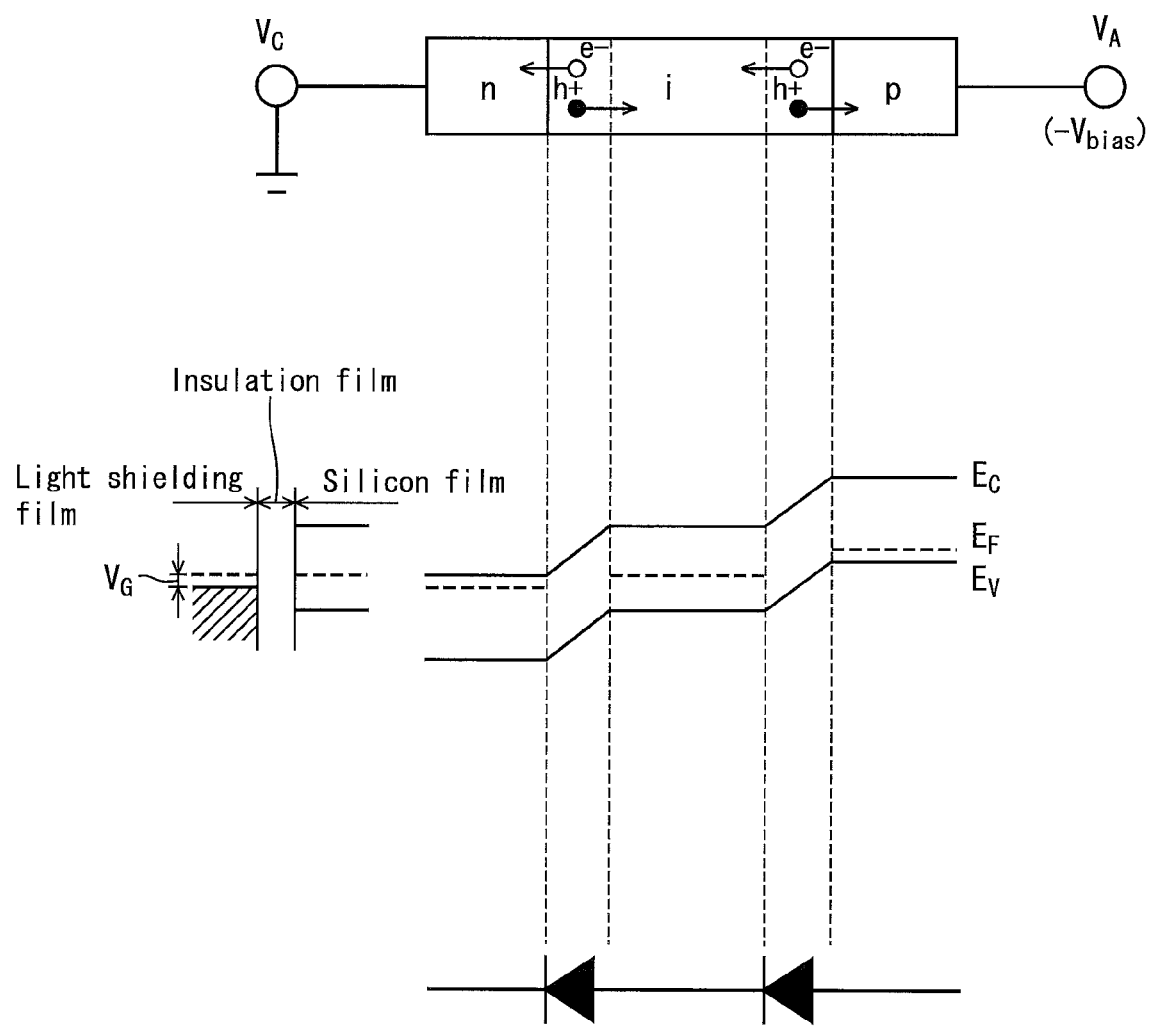
FIG. 13 shows a state of a potential of a light shielding film and a state of a photodiode.
Figure 14:
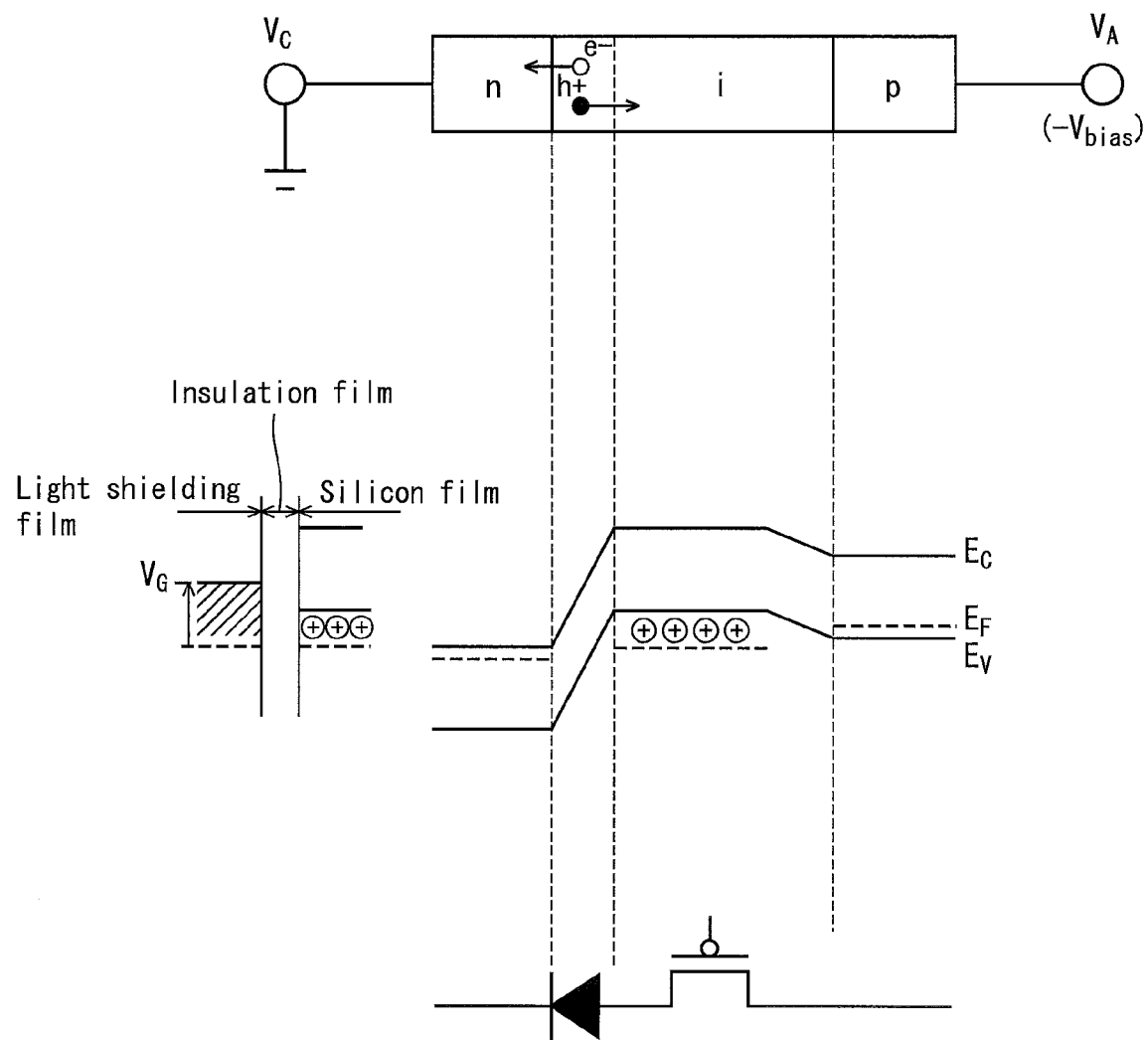
FIG. 14 shows a state of a potential of the light shielding film and a state of the photodiode.
Figure 15:
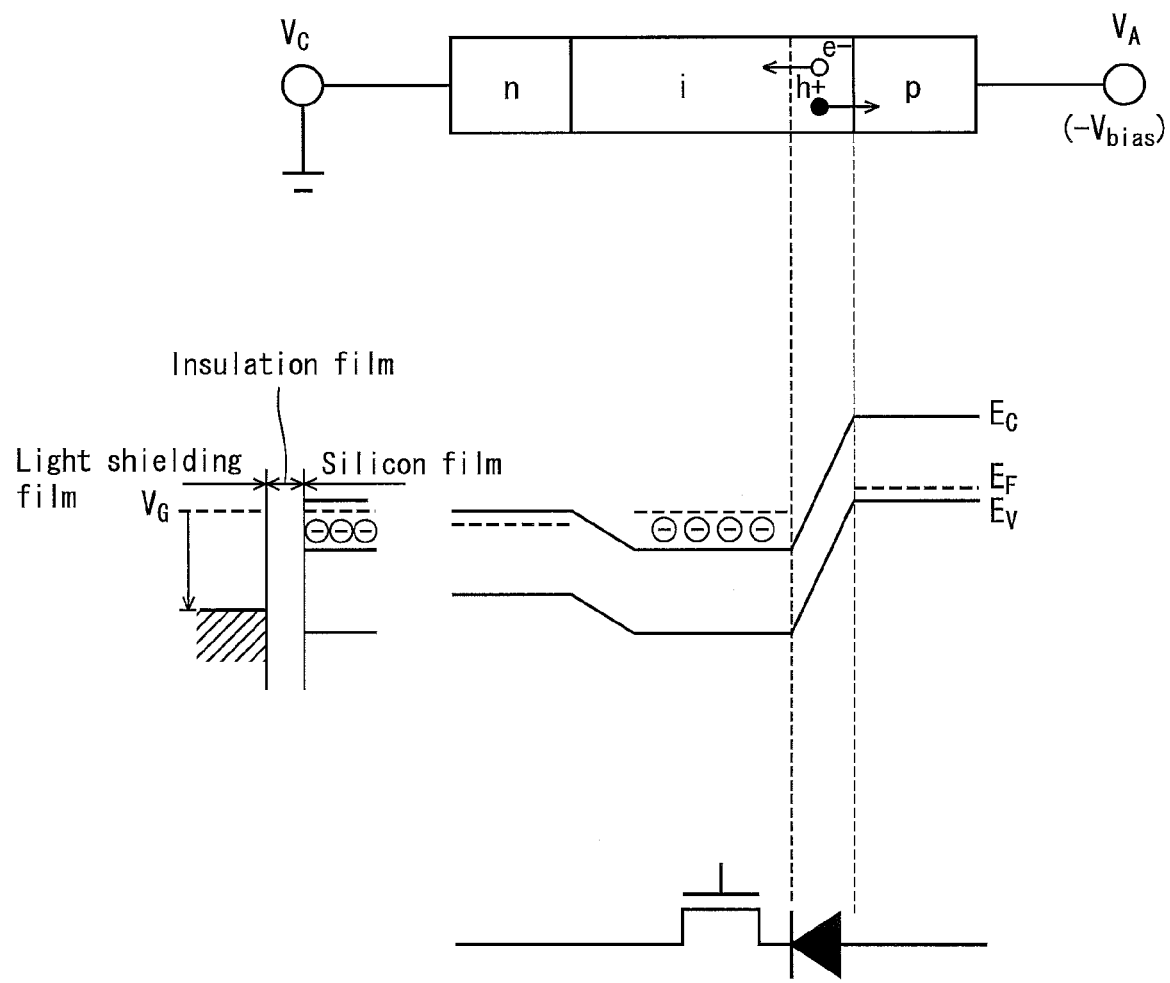
FIG. 15 shows a state of a potential of the light shielding film and a state of the photodiode.

FIGS. 13 to 15 show the potentials of the light shielding film LS and the states of the photodiodes D1a and D1b. In each drawing, the upper section shows flows of free electrons and positive holes in the photodiodes D1a and D1b, the middle section shows energy bands in the photodiodes D1a and D1b, and the lower section shows an equivalent circuit of the photodiodes D1a and D1b. FIG. 13 shows the state of the photodiodes D1a and D1b in the case where the potential $V_{LS}$ of the light shielding film LS satisfies the following formula (3). FIG. 14 shows the state of the photodiodes D1a and D1b in the case where the potential $V_{LS}$ of the light shielding film LS satisfies the following formula (4). FIG. 15 shows the state of the photodiodes D1a and D1b in the case where the potential $V_{LS}$ of the light shielding film LS satisfies the following formula (5).

$$(V_A+V_{th\_p})<V_{LS}<(V_C+V_{th\_n}) \quad (3)$$

$$V_{LS}<(V_A+V_{th\_p})<(V_C+V_{th\_n}) \quad (4)$$

$$(V_A+V_{th\_p})<(V_C+V_{th\_n})<V_{LS} \quad (5)$$

It should be noted $V_A$ represents a potential of the p-layers of the photodiodes D1a and D1b. $E_C$ represents an energy level in the conduction band, $E_f$ represents an energy level in the forbidden band, and $E_V$ represents an energy level in the valence band.

As shown in the upper section and the middle section of FIG. 13, in the case where the potential $V_{LS}$ of the light shielding film LS satisfies the formula (3) shown above (hereinafter this case is referred to as a "mode A"), vicinities of interfaces of the i-layers on both sides in the photodiodes D1a and D1b assume a state in which free electrons and positive holes easily migrate. Therefore, as shown in the lower section of FIG. 13, an electric current can smoothly flow through the inside of the photodiode in the mode A.

On the other hand, as shown in the upper section and the middle section of FIG. 14, in the case where the potential $V_{LS}$ of the light shielding film LS satisfies the formula (4) shown above (hereinafter this case is referred to as a "mode B"), only vicinities of interfaces of the i-layers on the n-layer side assume a state in which free electrons and positive holes easily migrate. Therefore, as shown in the lower section of FIG. 14, the flow of an electric current is obstructed by the i-layer in the mode B.

Further, as shown in the upper section and the middle section of FIG. 15, in the case where the potential $V_{SL}$ of the light shielding film LS satisfies the formula (5) shown above (hereinafter this case is referred to as a "mode C"), only vicinities of interfaces of the i-layers on the p-layer side assume a state in which free electrons and positive holes easily migrate. Therefore, as shown in the lower section of FIG. 15, the flow of an electric current is obstructed by the i-layer in the mode C as well, as is the case with the mode B.

Figure 16:
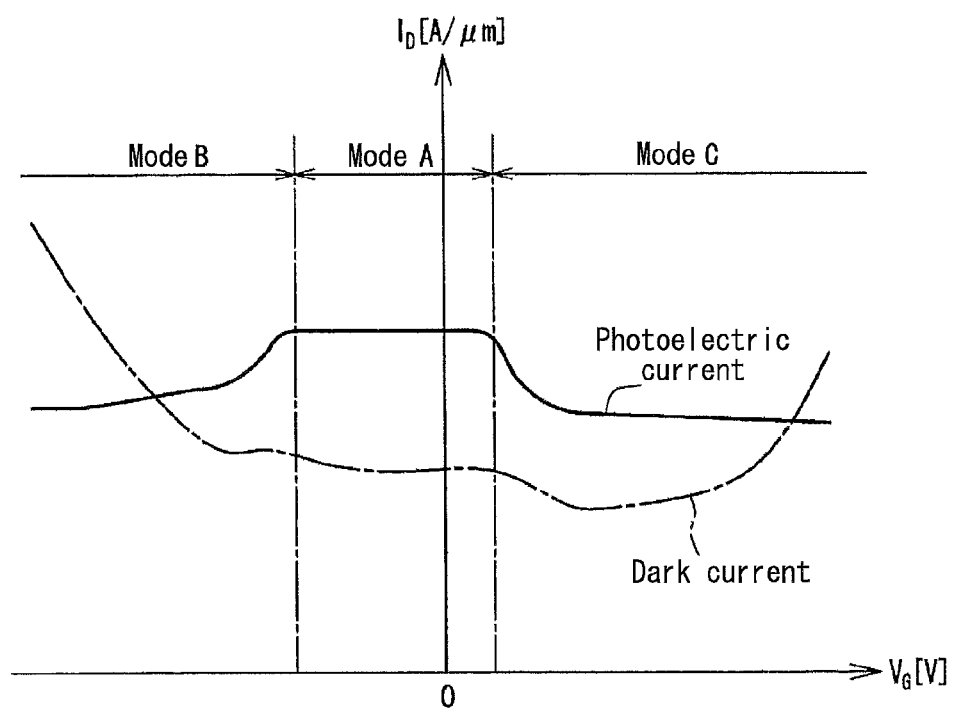
FIG. 16 shows a relationship between a photoelectric current of a photodiode and a potential of a light shielding film.

Next, the relationship between each mode and a photoelectric current is explained with reference to FIG. 16. FIG. 16 shows the relationship between a photoelectric current and a potential of the light shielding film in a photodiode. In FIG. 16, the vertical axis indicates current values [A/μm] of electric currents output from the photodiodes D1a and D1b, and the horizontal axis indicates the potential $V_{LS}$ [V] of the light shielding film LS.

As shown in FIG. 16, the photoelectric current and the dark current of the photodiodes D1a and D1b fluctuate with the potential $V_{LS}$ of the light shielding film LS. In the mode A, the photoelectric current tends to increase most, and the dark current tends to decrease most. In other words, when the photodiodes D1a and D1b is in the mode A, the ratio of the photoelectric current with respect to the dark current (S/N ratio) increases, and therefore, the output characteristics of the photodiodes are improved.

Figure 17A:
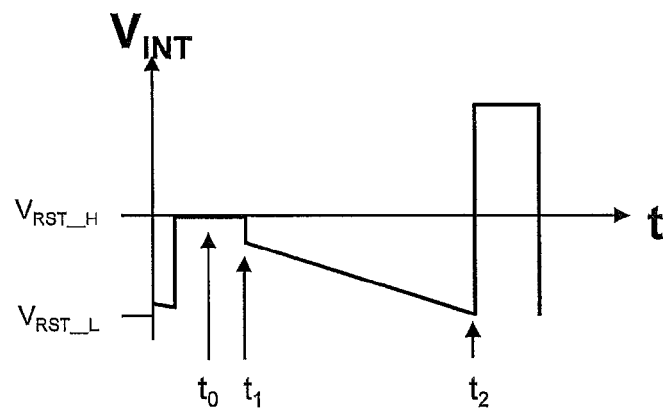
FIGS. 17A and 17B show a relationship between variation of an accumulation node potential from resetting to readout and operation modes.
Figure 17B:
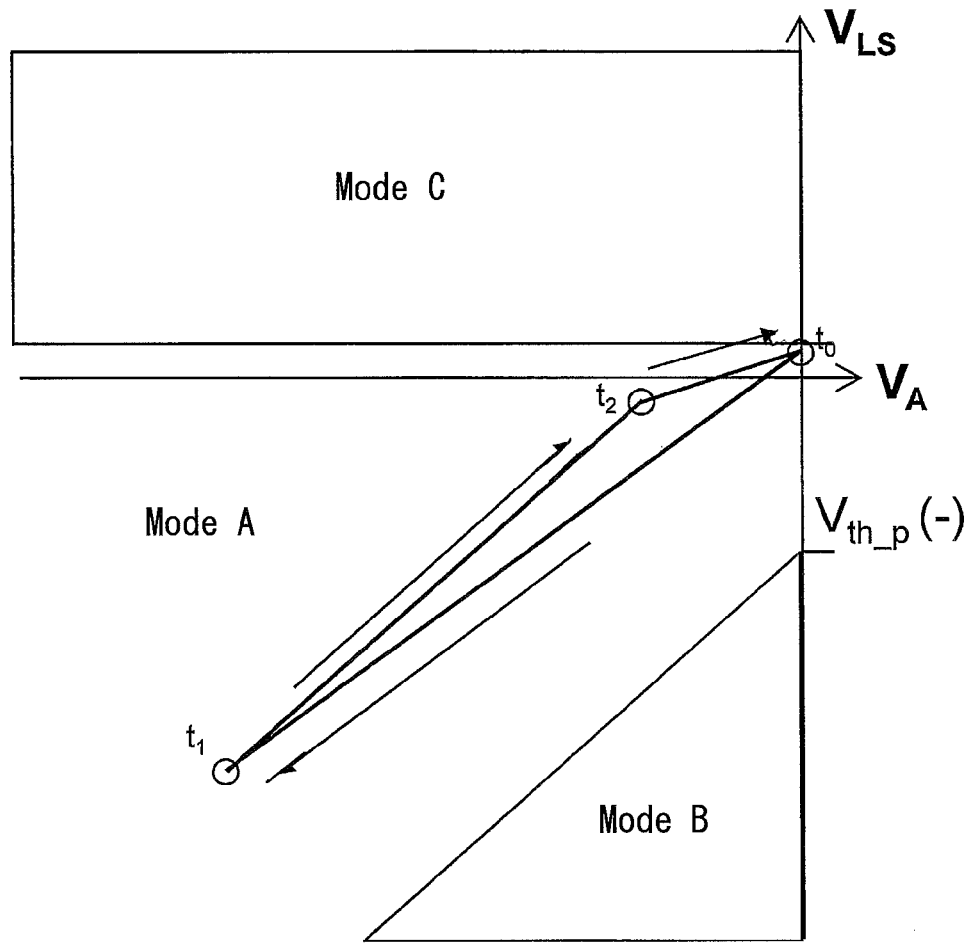

Here, the relationship between the variation of the potentials Vinta and Vintb of the accumulation nodes from the resetting to the readout and the operation modes is explained with reference to FIG. 17. FIG. 17A shows variation of the potentials Vinta and Vintb of the accumulation nodes from the resetting to the readout. FIG. 17B shows the relationship between the potential of the light shielding film LS and the potential $V_A$ in the p-layer of the photodiodes D1a and D1b. As shown in FIGS. 17A and 17B, if the above-described formula (1) is satisfied at the time t0 during the resetting, that is, $$V_{LS\_H} \geq V_{RST\_H}+V_{th\_p} \quad (1)$$

is satisfied, the photodiodes D1a and D1b operate in the region of the mode A from the time t0 to the time when the resetting is completed (time t1).

Further, if the above-described formula (2), that is, $$V_{RST\_L}+V_{th\_p} \leq V_{LS\_L} \leq V_C+V_{th\_n} \quad (2)$$

is satisfied at the time when the readout starts (time t2), the photodiodes D1a and D1b operate in the region of the mode A at the time t2 also.

Therefore, by applying the high level potential $V_{LS\_H}$ to the light shielding film LS only at the vicinities of the reset period and keeping the potential of the light shielding film LS at the low level potential $V_{LS\_L}$ during the other period, the photodiodes D1a and D1b can be caused to operate in the region of the mode A, and a sensor output having excellent linearity can be obtained.

Figure 18:
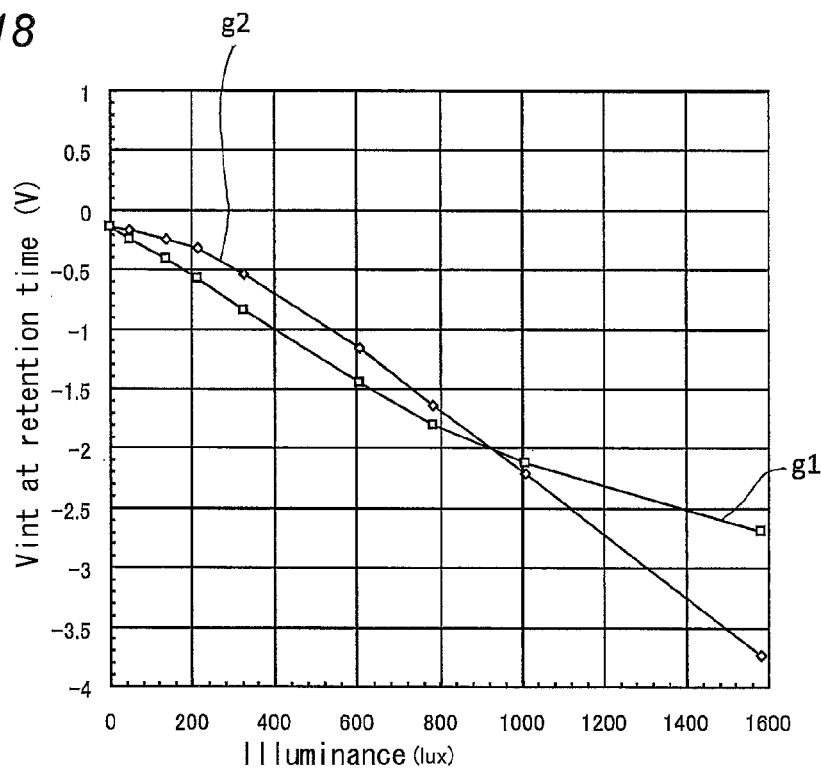
FIG. 18 is a graph showing variation of an accumulation node potential in the case where a potential of a light shielding film is kept at a constant potential, for comparison with the present embodiment.

FIG. 18 is a graph showing variation of the potential of the accumulation node in the case where the potential of the light shielding film LS is always kept at a constant level, for comparison with the present embodiment. In FIG. 18, "g1" indicates variation of the potential of the accumulation node in the case where the potential $V_{LS}$ of the light shielding film LS is kept to be the high level potential $V_{LS\_H}$ throughout the entire frame period, and "g2" indicates variation of the potential of the accumulation node in the case where the potential $V_{LS}$ of the light shielding film LS is kept to be the low level potential $V_{LS\_L}$ throughout the entire frame period. As is clear from FIG. 18, in the case where the potential $V_{LS}$ of the light shielding film LS is kept to be the high level potential $V_{LS\_L}$ (in the case of g1), degradation of the linearity is observed in a high illuminance region (at or above 800 lux). This is because the operation mode is switched from the mode A to the mode C during the accumulation period in the case where the amount of light is great. In the case where the potential $V_{LS}$ of the light shielding film LS is kept to be the high level potential $V_{LS\_L}$ (in the case of g2), degradation of the linearity is observed in a low illuminance region (at or below 300 lux). This is because the photodiodes, at the resetting and immediately after the resetting, operate in the mode B.

Figure 19:
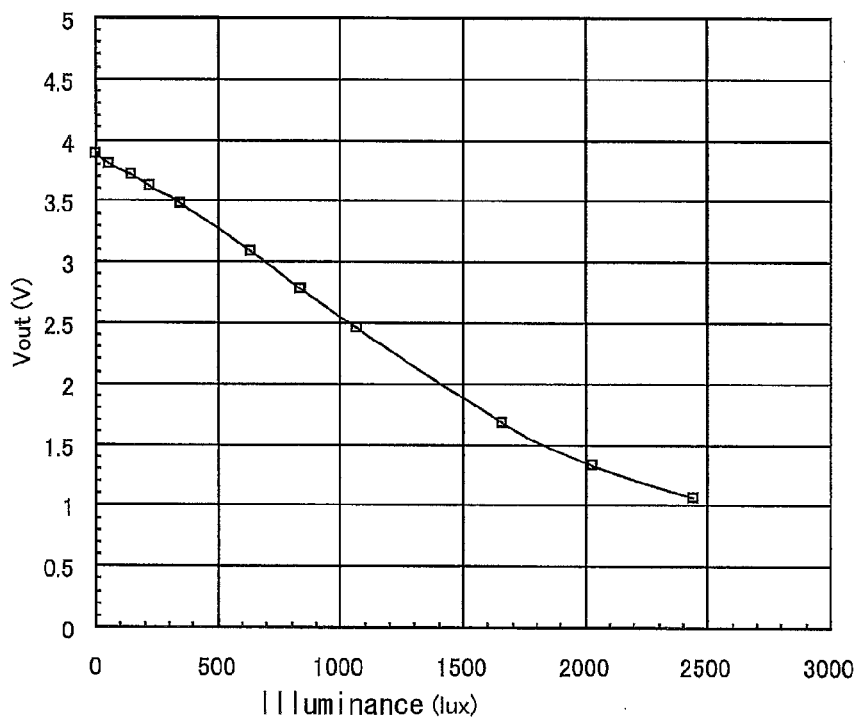
FIG. 19 is a graph showing variation of an accumulation node potential in the configuration according to the present embodiment.
Figure 20:
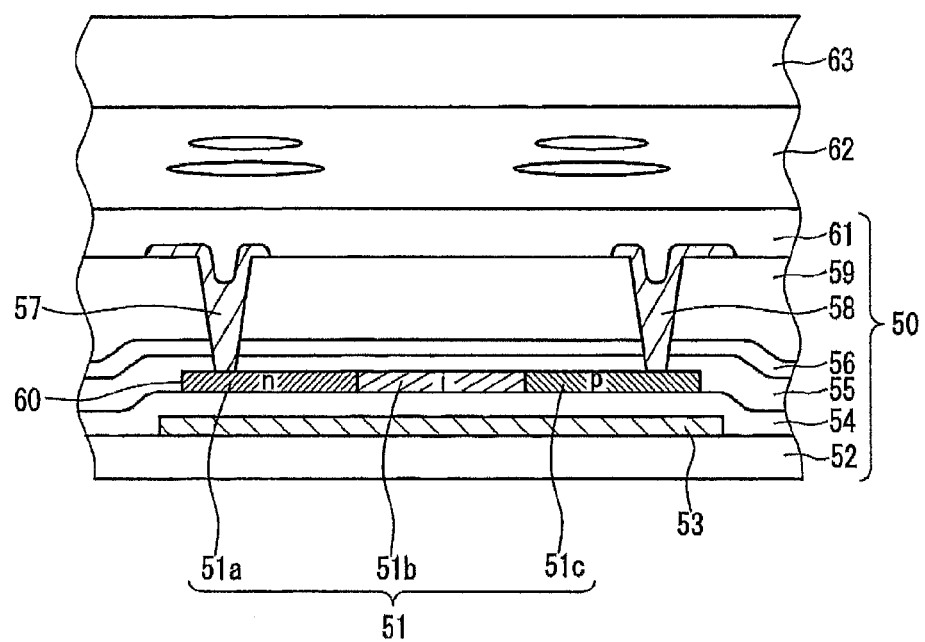
FIG. 20 is a cross-sectional view showing a configuration of a conventional liquid crystal display panel provided with a photodiode.

On the other hand, FIG. 19 is a graph showing variation of a voltage output to the output line OUT in the configuration according to the present embodiment, that is, in the case where the high level potential $V_{LS\_H}$ is applied to the light shielding film LS during a period that at least partially overlaps the reset period, and the potential of the light shielding film LS is kept to be the low level potential $V_{LS\_L}$ during the other period. As is clear from the comparison between FIG. 18 and FIG. 19, the linearity of the sensitivity characteristics is improved in the case of the present embodiment.

Further, with the display device according to the above-described embodiment, the input function that is independent from light environments can be provided. This is because in the display device, there are separately provided the first sensor pixel circuits that detect light during the detection period in the backlight-on period and retains the detected light amount during the other period, and the second sensor pixel circuits that detect light during the detection period in the backlight-off period and retains the detected light amount during the other period, whereby a difference between the amounts of light of the two types can be determined outside the sensor pixel circuits so that a difference between the amount of light during the backlight-on period and the amount of light during the backlight-off period can be determined.

It should be noted that the embodiment of the present invention is not limited to the above-described embodiment. The present invention may be modified arbitrarily regarding the configurations of the sensor pixel circuits and the method for driving the sensor pixel circuits as long as the following requirement is satisfied: the high level potential $V_{LS\_L}$ is applied to the light shielding film LS during a period that at least partially overlap the reset period, and the potential of the light shielding film LS is kept to be the low level potential $V_{LS\_H}$ during the other period.

For example, in the above-described embodiment, one backlight-on period A1 and one backlight-off period A2 are provided in one frame period, but the numbers of the backlight-on periods A1 and the backlight-off periods A2 are not limited to the above-described numbers.

Further, in the above-described embodiment, the first sensor pixel circuits that detect light during the detection period in the backlight-on period, and the second sensor pixel circuits that detect light during the detection period in the backlight-off period, are provided separately, and clock signals CLK are supplied to these sensor pixel circuits, respectively, so that an amount of light during the backlight-on period and an amount of light during the backlight-off period are detected separately and a difference between these light amounts is detected. However, in a configuration in which the first sensor pixel circuits are provided all over an entirety of the display panel and detect only the amount of light during the backlight-on period, the same effect as that described above can be obtained also, by applying the high level potential $V_{LS\_H}$ to the light shielding film LS during a period that at least partially overlaps the reset period, and keeping the potential of the light shielding film LS at the low level potential $V_{LS\_L}$ during the other period.

It should be noted that in the present invention, the type of the light source provided in the display device is not limited particularly. Therefore, for example, a visible backlight provided for display may be turned on and off once or a plurality of times during one frame period. Alternatively, separately from the visible backlight for display, an infrared backlight for light detection may be provided in the display device. In such a display device, the visible backlight is kept in an ON state always, and only the infrared backlight may be turned on and off once or a plurality of times during one frame period.

The present invention is industrially applicable as a display device that has an optical sensor on an active matrix substrate and is capable of capturing images.

The invention claimed is:

1. A display device comprising an optical sensor on an active matrix substrate, wherein the optical sensor includes:
   a photodetecting element for receiving incident light;
   a reset signal line for supplying a reset signal to the optical sensor;
   a readout signal line for supplying a readout signal to the optical sensor; and
   a sensor switching element for reading out a photoelectric current output from the photo detecting element, according to the readout signal, during a period from the supply of the reset signal to the supply of the readout signal, wherein
   the display device further comprises:
      a light shielding film provided on a back side of the photo detecting element; and
      a driving circuit for switching a potential of the light shielding film between a high level potential and a low level potential;
   the driving circuit causes the light shielding film to have the high level potential during a period that at least partially overlaps a period while the reset signal is supplied to the reset signal line;
   the photodetecting element is a diode having a PIN structure; and
   the following formula is satisfied:
   $$V_{LS\_H} \geq V_{RST\_H} + V_{th\_p}$$
   where $V_{LS\_H}$ represents the high level potential of the light shielding film, $V_{RST\_H}$ represents a high level potential of the reset signal, and $V_{th\_p}$ represents a threshold voltage of an assumed p-channel MOS transistor where a p-layer of the photodiode is a source-drain region and the light shielding film is a gate electrode.

2. The display device according to claim 1, wherein the driving circuit causes the light shielding film to have the high level potential during a period that overlaps an entirety of the period while the reset signal is supplied to the reset signal line.

3. A display device comprising an optical sensor on an active matrix substrate, wherein the optical sensor includes:
   a photodetecting element for receiving incident light;
   a reset signal line for supplying a reset signal to the optical sensor;
   a readout signal line for supplying a readout signal to the optical sensor; and
   a sensor switching element for reading out a photoelectric current output from the photo detecting element, according to the readout signal, during a period from the supply of the reset signal to the supply of the readout signal, wherein
   the display device further comprises:
      a light shielding film provided on a back side of the photo detecting element; and
      a driving circuit for switching a potential of the light shielding film between a high level potential and a low level potential;
   the driving circuit causes the light shielding film to have the high level potential during a period that at least partially overlaps a period while the reset signal is supplied to the reset signal line;
   the photodetecting element is a diode having a PIN structure; and
   the following is satisfied:
   $$V_{RST\_L} + V_{th\_p} \leq V_{LS\_L} \leq V_C + V_{th\_n}$$
   where $V_{LS\_L}$ represents the low level potential of the light shielding film, $V_{RST\_L}$ represents a low level potential of the reset signal, $V_C$ represents a potential in an n-layer of the photodiode, $V_{th\_p}$ represents a threshold voltage of an assumed p-channel MOS transistor where a p-layer of the photodiode is a source-drain region and the light shielding film is a gate electrode, and $V_{th\_n}$ represents a threshold value of an assumed n-channel MOS transistor where the n-layer of the photo diode is a source-drain region and the light shielding film is a gate electrode.

4. The display device according to claim 3, wherein the driving circuit causes the light shielding film to have the high level potential during a period that overlaps an entirety of the period while the reset signal is supplied to the reset signal line.

* * * * *